(12) United States Patent
Peng et al.

(10) Patent No.: US 6,897,489 B1
(45) Date of Patent: May 24, 2005

(54) (ALGA)INPN HIGH BRIGHTNESS WHITE OR DESIRED COLOR LED'S

(76) Inventors: Hui Peng, 35964 Vivian Pl., Fremont, CA (US) 94536; Gang Grant Peng, 32 Mission Cielo, Fremont, CA (US) 94536

(*) Notice: Subject to any disclaimer, the term of this patent is extended or adjusted under 35 U.S.C. 154(b) by 0 days.

(21) Appl. No.: 10/797,339

(22) Filed: Mar. 10, 2004

(51) Int. Cl.$^7$ ............. H01L 29/221; H01L 29/22; H01L 29/24
(52) U.S. Cl. ............. 257/96; 257/94; 257/103
(58) Field of Search ............. 257/85, 86, 87, 257/90, 94, 96, 98, 103

(56) References Cited

U.S. PATENT DOCUMENTS

| | | | |
|---|---|---|---|
| 5,684,309 A | * | 11/1997 | McIntosh et al. ........... 257/191 |
| 6,163,038 A | | 12/2000 | Chen et al. |
| 6,649,943 B2 | | 11/2003 | Shibata et al. |
| 2003/0164507 A1 | * | 9/2003 | Edmond et al. ........... 257/85 |
| 2003/0173573 A1 | | 9/2003 | Udagawa |
| 2004/0026705 A1 | * | 2/2004 | Kato et al. ........... 257/94 |

* cited by examiner

*Primary Examiner*—Ngân V. Ngô

(57) ABSTRACT

Group III–V compound semiconductor high brightness white or desire color light emitting diodes (LEDs) are disclosed. One of embodiments of the LEDs of the present invention comprises a first active layer, a second active layer, and a transition active layer sandwiched between the first and the second active layers, and is flip chip bonded on an electrically conductive submount for faster heat dissipation. Material systems for active layers of the LEDs of the present invention comprise $(Al_x Ga_{1-x})_y In_{1-y} P_z N_{1-z}$. With combinations of different values of "x", "y", and "z", the active layers and the transition active layer emit lights of different wavelengths. Appropriately adjusting wavelengths and intensities of emitted lights provides high brightness white or desire color.

15 Claims, 6 Drawing Sheets

(ALGA)INPN HIGH BRIGHTNESS WHITE OR DESIRED COLOR LED'S

BACKGROUND OF THE INVENTION (1) Field of the Invention

The present invention relates to group III–V compound semiconductor high brightness white or desire color light emitting diodes (LEDs).

(2) Prior Art

Extensive efforts have been devoted to develop white LEDs and white LED assemblies, including (1) using wavelength converter materials including fluorescent materials, phonton-recycling semiconductors, and dye; (2) integrating red, green, and blue LEDs (RGB LEDs) into a LED lamp (3) stacking two LED chips of different wavelengths; and (4) growing more than one active layers emitting lights of different wavelengths on a substrate patents for this method include U.S. Pat. Appl. No. 20030173573, by Udagawa, U.S. Pat. No. 6,649,943 by Shibata, et al., and U.S. Pat. No. 6,163,038, by Chen, et al.

Several different material systems including GaInPN, GaInN, and GaPN for emitting white light are disclosed in above patents. A common practice for generating white light is to combine blue and yellow lights. In order to have the same chromaticity coordinate as illuminant D.sub.65, the complementary wavelengths and power ratio of two complementary monochromatic lights are required to satisfy the following relation:

| Complementary wavelengths: Lambda | | Power ratio |
|---|---|---|
| Lambda.sub.1 | Lambda.sub.2 | P(Lambda.sub.2)/P(Lambda.sub.1) |
| 430 nm | 562 nm | 1.4 |
| 440 nm | 563 nm | 1.8 |
| 450 nm | 564 nm | 1.8 |
| 460 nm | 566 nm | 1.5 |
| 470 nm | 570 nm | 1.1 |

The above disclosed material systems do not emit yellow light as bright as that of the material system (AlGa)InP. Therefore to be able to emit white light from the LEDs of those material systems, the intensity of blue light needs to be dimmed. So the existing white LEDs with above mentioned material systems do not have high brightness. Therefore there is a need for high brightness white or desire color LEDs.

BRIEF SUMMARY OF THE INVENTION

In the present invention group III–V compound semiconductor high brightness white or desire color LEDs are disclosed. The mechanism for generating white light by the LEDs of the present invention is either emitting two complementary lights (for example, blue and yellow) or emitting light over the entire visible spectrum which is approximately the spectrum of the light from the Sun.

One of embodiments of the LEDs of the present invention comprises a material system (Al.sub.xGa.sub.1-x) sub.yIn.sub.1-yP.sub.zN.sub.1-z that emits white or desire color light and is flip chip bonded on an electrically conductive submount for better heat dissipation and higher light extraction efficiency.

The primary object of the present invention is to provide new material systems for high brightness white or desire color LEDs.

The second object of the present invention is to provide high brightness white or desire color LEDs and LED lamps with high light extraction efficiency.

The third object of the present invention is to provide methods for manufacturing high brightness white or desire color LEDs.

Further objects and advantages of the present invention will become apparent from a consideration of the ensuing description and drawings.

BRIEF DESCRIPTION OF THE SEVERAL VIEWS OF DRAWINGS

The novel features believed characteristics of the present invention are set forth in the claims. The invention itself, as well as other features and advantages thereof will be best understood by referring to detailed descriptions that follow, when read in conjunction with the accompanying drawings.

DETAILED DESCRIPTION OF THE INVENTION

Figure 1:
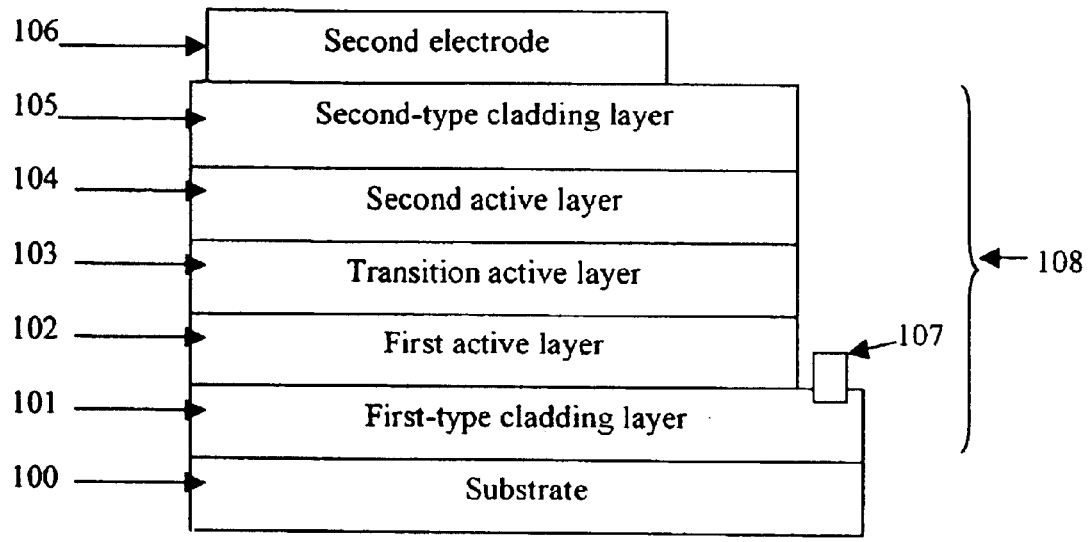
FIG. 1 is a cross sectional view of a LED of the present invention with two electrodes on the same side of a substrate.

While embodiments of the present invention will be described below, those skilled in the art will recognize that combinations of different values of "x", "y", and "z" in the material system (Al.sub.xGa.sub.1-x).sub.yIn.sub.1-yP.sub.zN.sub.1-z (0<x$\leq$1, 0<y$\leq$1, and 0$\leq$z<1) are capable of providing the LEDs of the present invention. Thus the following description is illustrative only and not limiting.

Reference is specifically made to the drawings wherein like numbers are used to designate like members throughout.

Note that the following are applied to all of embodiments of the LEDs of the present invention.

(1) Material systems for active layers of the LEDs of the present invention are selected from a group comprising (Al.sub.xGa.sub.1-x).sub.yIn.sub.1-yP.sub.zN.sub.1-z (0<x1, 0<y$\leq$1, 0$\leq$z<1). The desire intensities and wavelengths of emitted lights may be reached by adjusting thicknesses and selecting compositional proportions, i.e., values of "x", "y", and "z", of active layers, so that two or more mixing lights emitted by the active layers provide the desire color, according to the chromaticity diagram.

A first active layer emitting light of first wavelength that is shorter is grown on a first-type cladding layer that is grown on a substrate at an elevated temperature higher than that for growing a second active layer emitting light of second wavelength that is longer, for preventing diffusion. The growth temperature is depending on the material systems selected.

One of embodiments of the present invention is white or desire color LEDs having the material system (Al.sub.xGa.sub.1-x).sub.yIn.sub.1-yP.sub.zN.sub.1-z ($0<x\leq 1$, $0<y\leq 1$, $0\leq z\leq 1$) with fixed values of both "x" and "y". By adjusting the value of "z", the first active layer emits blue light. By adjusting to a different value of "z", the second active layer emits either yellow or red light depending on the desire color.

Another embodiment of the present invention is to employ the $(Al_xGa_{1-x})_yIn_{1-y}P_zN_{1-z}$ material system and adjust values of "x", "y", and "z". The crystal growth of the $(Al_xGa_{1-x})_yIn_{1-y}P_zN_{1-z}$ active layer starts with values of "x", "y", and "z" suitable for emitting blue light and having a direct bandgap. The values of "x", "y", and "z" are so determined that while emitting blue light, the value of "x" is large without cracking the epitaxial wafer due to Al, the value of "y" is large, and the value of "z" is small to minimize the lattice mismatch. Then grows the first active layer to a pre-determined thickness at the same values of "x", "y", and "z".

Then continuously growing the transition active layer by either gradually decreasing the value of "x", or gradually decreasing the value of "y" as long as avoiding the re-evaporation of In from the growth surface, or gradually increasing the value of "z", or combinations of varying all of values of "x", "y", and "z", until reaching certain values of "x", "y", and "z", so that the emitted light is either yellow or red.

Then continuously growing the second active layer to a pre-determined thickness while holding the value of "x", "y", and "z" as constants. The thicknesses of the first and second active layers may be different for better color control and rendering. The temperatures for growing the first and second active layers are at elevated temperatures of approximate 700 to 900 degree C.

During the growth of the transition active layer, each set of values of "x", "y", and "z" defines a sub-transition action layer. The thickness of each sub-transition active layers is pre-determined according to the desire color. The transition active layer emits light of a spectrum from blue to yellow or red. The intensity of each of intermediate color lights may be adjusted by the thickness of that sub-transition active layer.

Third embodiment of the present invention is to employ the $(Al_xGa_{1-x})_yIn_{1-y}N$ material system for the first active layer emitting blue light and grown at temperature range of 950 to 1150 degree C. Then lower the temperature to a range of 700 to 900 degree C and grow a transition active layer with gradually introducing phosphorus P by passing $PH_3$ to the reactor chamber until the emitted light becomes yellow. The transition and second active layers have a material system $(Al_xGa_{1-x})_yIn_{1-y}N_zP_{1-z}$.

(2) The materials of first-type and second-type cladding layers are respectively determined by the material systems of active layers and are selected from a group comprising $B_xAl_yGa_zIn_{1-x-y-z}P_uN_{1-u}$ ($0<x\leq 1$, $0\leq y<1$, $0\leq z<1$, $x+y+z\leq 1$, $0\leq u<1$). For a LED of the present invention, the material of first-type cladding layer may be either different from that of second-type cladding layer or the same but with different compositional proportions for improving lattice mismatching.

The carrier concentration in both cladding layers is preferred to be in a range of $10^{17}$ cm$^{-3}$ to $10^{21}$ cm$^{-3}$. The preferred thickness of the first-type cladding layers is in a range of 100 nm to 10 micrometer. For a LED of the present invention flip chip bonded on a submount and with the original substrate removed by lapping method, the preferred thickness of the first-type cladding layers is depending on the combination of the total thickness variations of both the substrate and the submount.

For preventing the thermal diffusion of phosphorus P and/or boron B between the first-type cladding layer and the first active layer, a barrier layer may be disposed between the two layers, as well as for the second-type cladding layer and the second active layer. The energy band gaps of the barrier layers are larger than that of the first active layer.

(3). Submounts for the LEDs of the present invention are selected from a group comprising electrically conductive Si, SiC, and thin films of Cu and Al. The submounts have high thermal conductivity. Therefore for high power applications, the high power LEDs of the present invention are flip chip bonded on a submount for fast heat dissipation.

With the epitaxial layer flip chip bonded on an electrically conductive submount and the original substrate is removed, two electrode are respectively disposed on both sides of the LED, and the first electrode is patterned so that the current crowding effect may be reduced, forward voltage is lower, the current distribution is more uniformly, and the electric static discharge (ESD) property is improved. Since the flip chip bonding employed in the present invention is a wafer level, the throughput is much higher than convention chip level flip chip bonding.

The second active layer emitting light of longer wavelength is always closer to the submount than the first active layer of shorter wavelength.

(4). Materials for a reflector/Ohmic layer sandwiched between a submount and a second-type cladding layer are selected from a group comprising Ag, Al, Au, In, Ni, Pd, Pt, Rh, Ti, W, alloys of above metals, and TiN or HfN.

The materials for a reflector/Ohmic layer are selected by taking into account: (a) the reflectivity at the wavelength; (b) adhesive strength to the second-type cladding layer; and (c) generating a good electrical/Ohmic contact.

(5). A substrate for growing the epitaxial layer of the LEDs of the present invention may be selected from a group comprises $Al_2O_3$ (sapphire), GaAs, and GaP wafers.

There are several methods to reduce the effects of lattice mismatch between a substrate and an epitaxial layer 1. Growing a buffer layer on the substrate and then growing the epitaxial layer on the buffer layer; 2. Directly growing the epitaxial layer on a textured substrate to localize and minimize the effects of lattice mismatch; 3. Growing a buffer layer on the textured substrate and then growing the epitaxial layer on the buffer layer; 4. After growing the desired epitaxial layer on a substrate, flip chip bonding the epitaxial layer to a submount, then removing the substrate (including the buffer layer) and annealing the epitaxial layer. U.S. patent application Ser. No. 10/723046 discloses the detail of texturing a substrate to localize and minimize the effects of lattice mismatch.

For a conventional flip chip bonded blue LED, portion of emitted light is trapped by the totally internal reflections at the interfaces: (1) between the epitaxial layer and the sapphire substrate; (2) between the sapphire substrate and a dome covering the LED; and (3) between the dome and air. In order to improve heat dissipation, eliminate the totally internal reflections, and improve the light extraction efficiency, the substrate is removed after the growth of the epitaxial layer. Methods for removing sapphire substrate comprise mechanical lapping/polishing and laser melting. U.S. patent applicaton Ser. No. 10/765346 disclosed the detail of removing sapphire substrate by mechanical lapping/polishing.

FIG. 1 shows an embodiment of the LEDs of the present invention.

Epitaxial layer 108 growing on substrate 100 comprises first-type cladding layer 101, first active layer 102 emitting light of first wavelength, second-type cladding layer 105, second active layer 104 emitting light of second wavelength, and transition active layer 103 sandwiched between first and second active layers. First wavelength is shorter than second wavelength. Transition active layer 103 emits light of spectrum between first and second wavelengths. This embodiment allows controlling the color of mixed lights to some degree by choosing the intensities and wavelengths of lights emitted by first, transition, and second active layer 102, 103, and 104 respectively. The intensities and wavelengths of lights may be adjusted by selecting different thickness and compositional proportions of active layers respectively.

Second electrode 106 disposes on second-type cladding layer 105. A predetermined area is etched down until first-type cladding layer 101 exposed, then first electrode 107 is disposed on the exposed portion of first-type cladding layer 101. Second electrode 106 and first electrode 107 are so patterned that the current crowding effect is minimized, the material of active layers is maximum utilized, and the current distribution is more uniform.

Normally epitaxial layer 108 further comprises a current spreading layer (not shown in FIG. 1) sandwiched between second electrode 106 and second-type cladding layer 105, and a buffer layer (not shown in FIG. 1) sandwiched between first-type cladding layer 101 and substrate 100.

Figure 2:
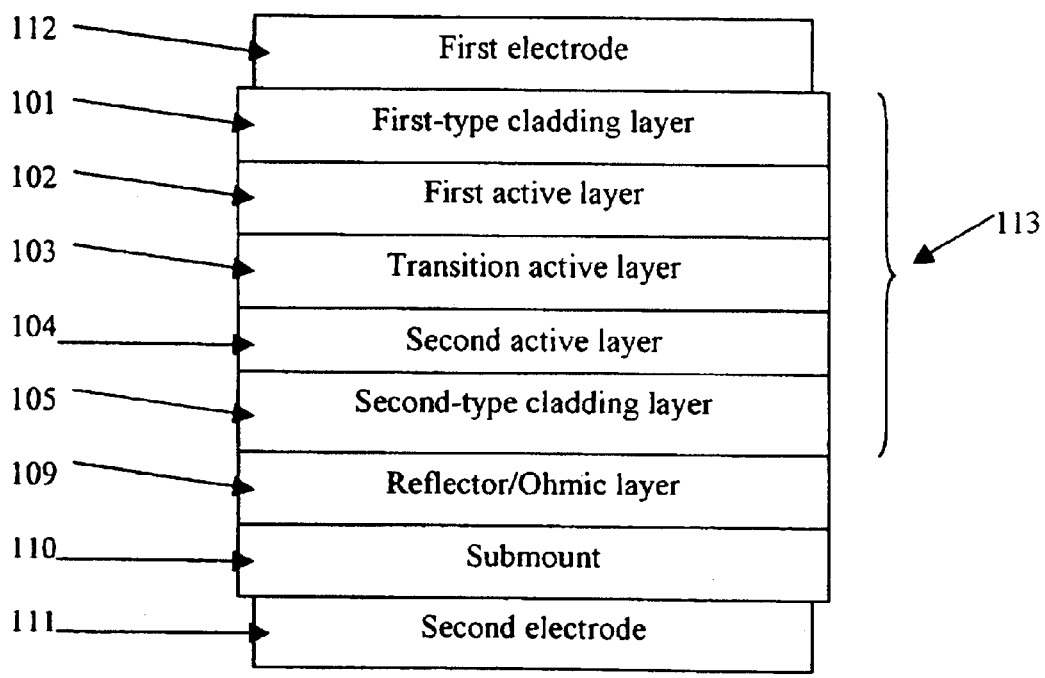
FIG. 2 is a cross sectional view of a LED of the present invention with two electrodes on the opposite sides of a submount respectively.

FIG. 2 shows second embodiment of the LEDs of the present invention. Epitaxial layer 113 is similar to epitaxial layer 108 of FIG. 1 and is grown on a substrate wafer which is then removed after flip chip bonding the LED epitaxial wafer to one side of a submount wafer. There is reflector/Ohmic layer 109 sandwiched between submount 110 and second-type cladding layer 105. First electrode 112 and second electrode 111 are disposed on first-type cladding layer 101 and the other side of submount 110 respectively. First electrode 112 is so patterned that the current crowding effect is minimized an the material of the active layers is maximum utilized, see FIGS. 3a to 3c.

There is no totally internal reflection between the epitaxial layer and substrate in this embodiment, since the substrate has been removed. A dome material doped with nano-particles may be selected which has the same or similar refractive index as that of the epitaxial layer, thus there is no totally internal reflection between the epitaxial layer and the dome. The diameter of the dome may be determined so that there is no totally internal reflection between the dome and air. Therefore the total internal reflections are eliminated, thus the light extraction efficiency is significantly improved, see FIG. 4b.

Figure 3A:
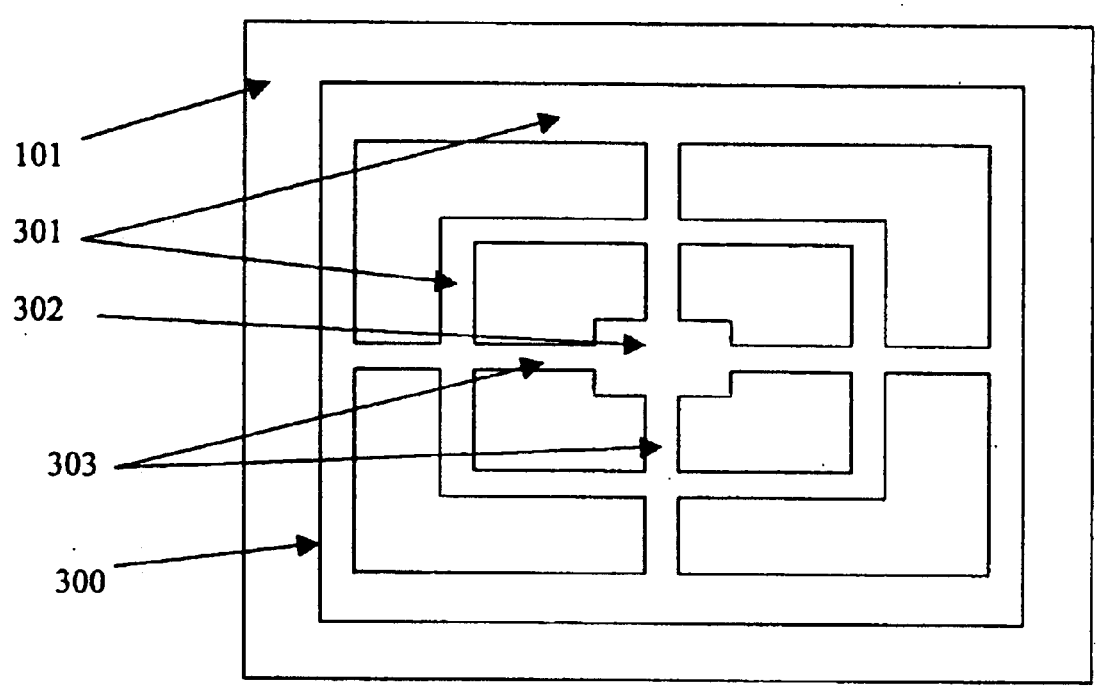
FIGS. 3a to 3c are top views of differently patterned first electrodes of FIG. 2.

FIG. 3a is a top view of an embodiment of first electrode 112 of FIG. 2 having plus-multi-ring-shape and disposed on first-type cladding layer 101. Patterned first electrode 300 comprises a plurality of ring 301, plus 303, and wire bonding pad 302, which are electrically connected. The plurality of ring 301 and plus 303 evenly spread the current introduced by wire bonding pad 302 through first-type cladding layer 101 of the LEDs of the present invention.

Figure 3B:
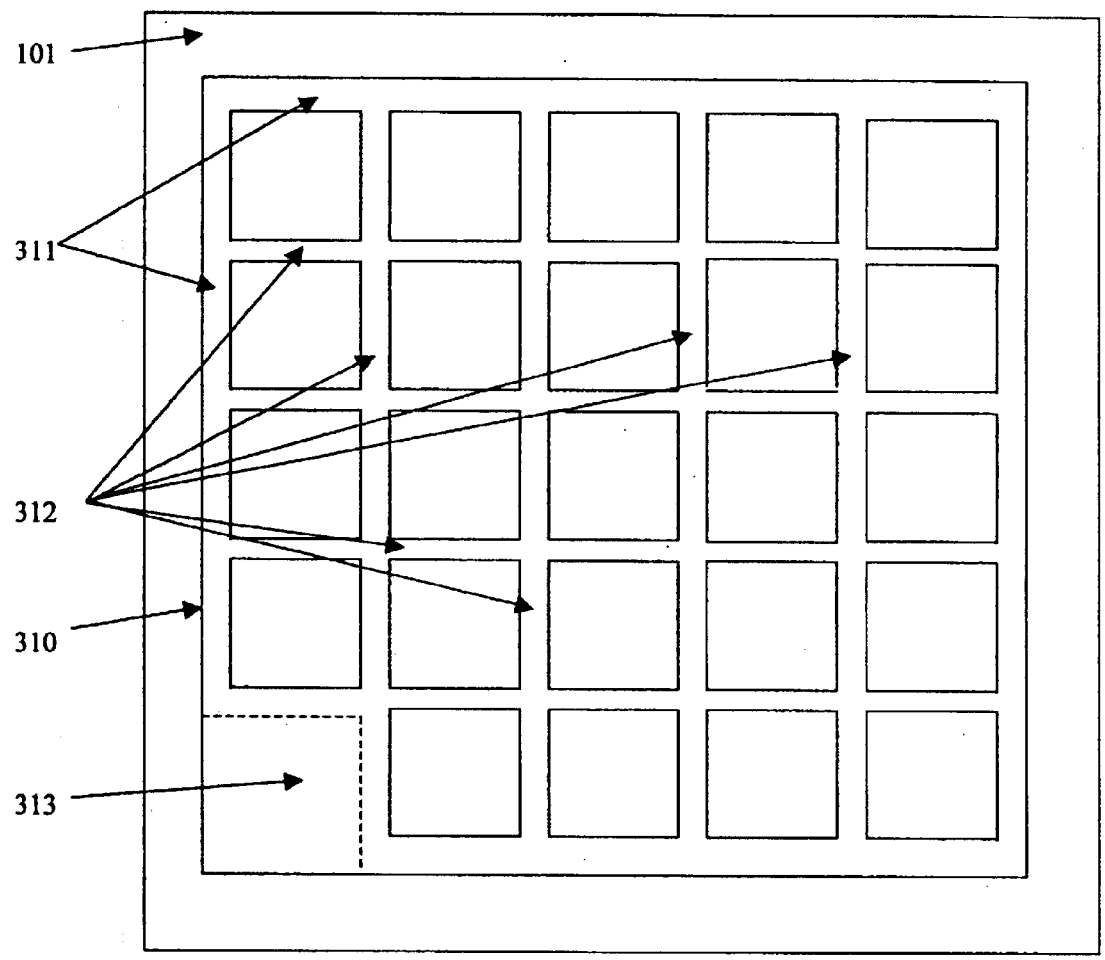
Figure 3C:
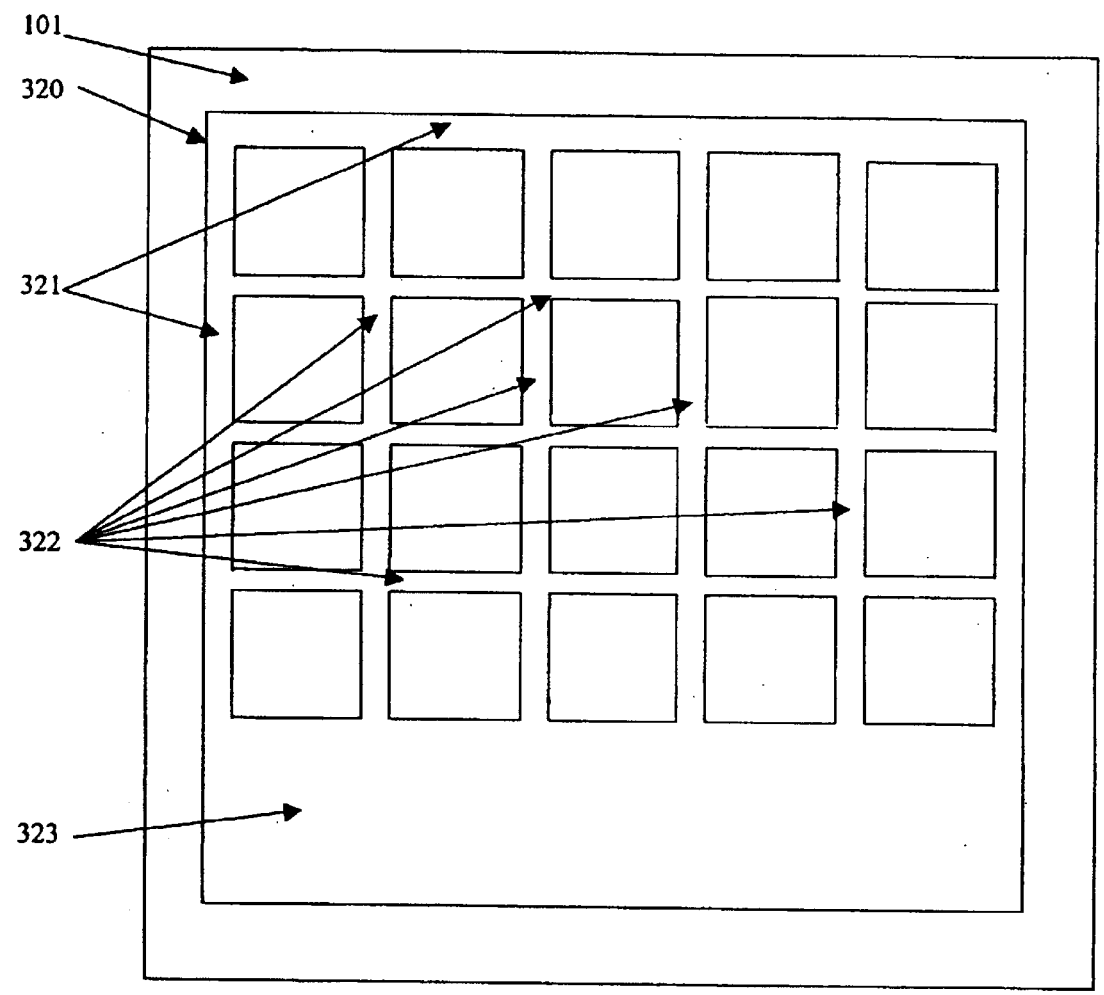

FIGS. 3b and 3c are top views of embodiments of first electrode 112 of FIG. 2 with similar patterns; ring-grid-shape. Patterned first electrode 310 of FIG. 3b comprises ring 311, grid 312, and wire bonding pad 313, which are electrically connected. Ring 311 and grid 312 evenly spread the current introduced by wire bonding pad 313 through first-type cladding layer 101. FIG. 3c shows patterned first electrodes 320 having a similar pattern of ring-grid-shape as that shown in FIG. 3b. Patterned first electrode 320 is for high power LEDs of the present invention and has a stripe-shaped wire bonding pad 323 that is for bonding multiple wires, therefore allow much higher current go through. Grid 322, ring 321 surrounding grid 322, and wire bonding pad 323 are electrically connected.

Figure 4A:
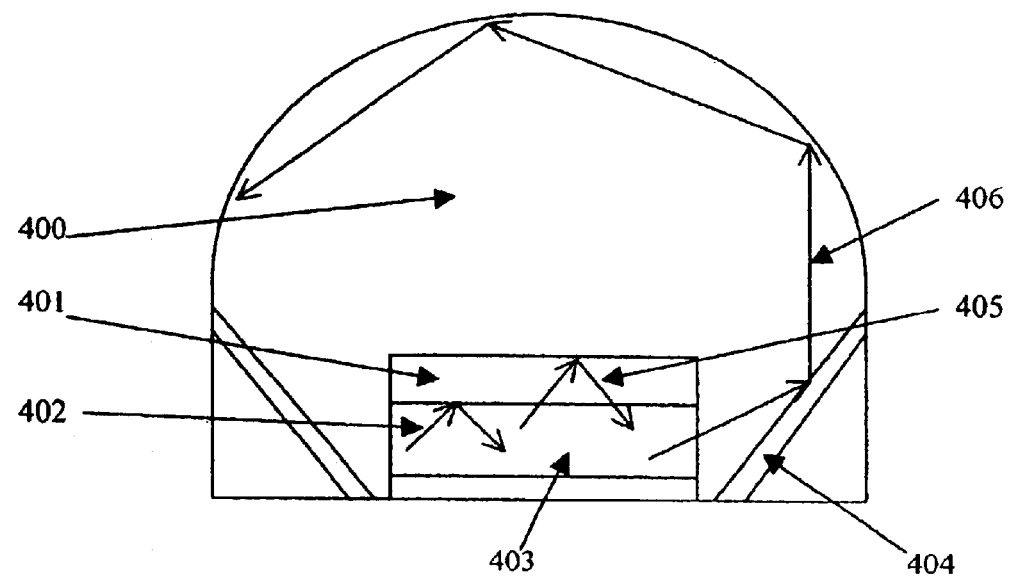
FIG. 4a is a cross sectional view of a LED lamp of prior art.

FIG. 4a shows a flip chip LED lamp of prior art with a substrate. The flip chip technique is employed for high power LEDs, since flip chip packages of LEDs have much better heat dissipation. Light 402 and light 405 emitted from active layer 403 are respectively reflected back by the interface between active layer 403 and transparent substrate 401 and the interface between substrate 401 and dome 400. Light 406 is totally reflected back at the interface between dome 400 and air. Note that a conventional LED lamp has a reflective cup 404 surrounded by dome 400. Therefore, there are 3 types of totally internal reflections at interfaces: between active layer 403 and substrate 401, between substrate 401 and dome 400, and between dome 400 and air, therefore the light extraction efficiency is low.

Figure 4B:
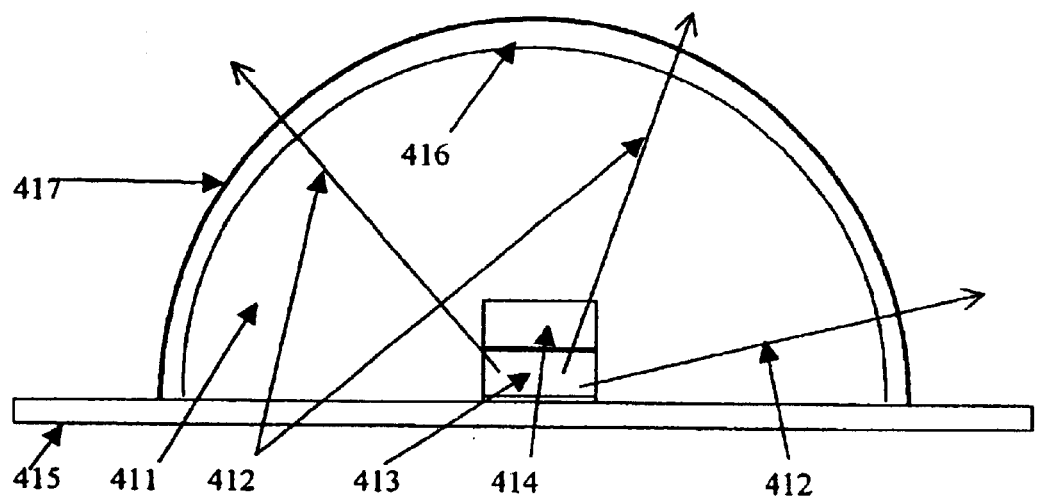
FIG. 4b is a cross section view of a LED lamp of the present invention.

FIG. 4b is an embodiment of a LED lamp of the present invention. A LED of the present invention is flip chip bonded on base 415 and comprises first-type cladding layer 414 and active layer 413 (including first, transition, and second active layers). The substrate that the epitaxial layer is grown on is removed. Dome 411 covers the LED and is formed from a material selected from a group comprising epoxy, glass, and plastics. Also the dome material is doped with nano-particles so that the refraction index of the material is either the same or similar to that of the material of the top epitaxial layer of the LED. Therefore, there is no totally internal reflection at the interface between first-type cladding layer 414 and dome 411. Anti-reflection coating 417 is coated on surface 416 of dome 411. First-type cladding layer 414 and active layer 413 have either the same or similar refractive index, therefore there is no totally internal reflection at the interface between the two.

From Snell's law, it can be shown that when $$R \geq nd, \quad (1)$$

where, R is the diameter of hemisphere-shaped dome, n is the refractive index of dome material, and d is the size of the LED, there is no totally internal reflection at the interface between dome 411 and air. Therefore it is easily to eliminate the totally internal reflection between dome and air by employing large enough hemisphere shaped dome.

Therefore all of three types of the totally internal reflections that a conventional LED lamp has are completely eliminated.

Figure 4C:
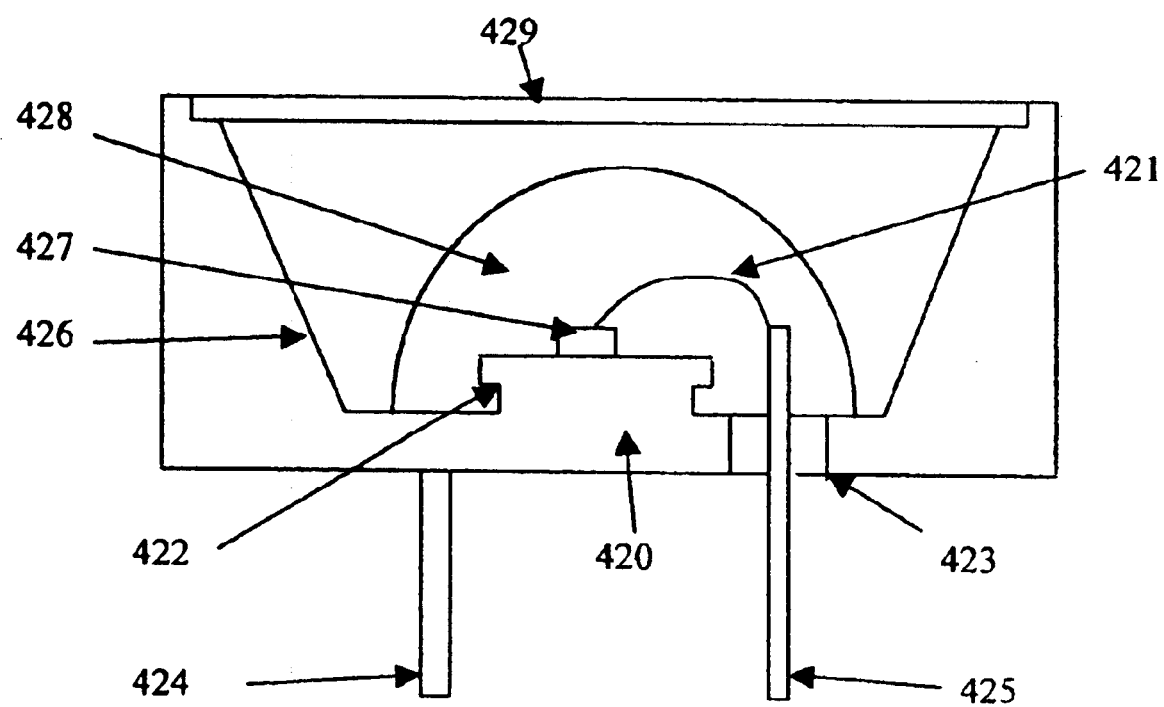
FIG. 4c is a cross sectional view of a LED lamp of the present invention with a reflective cup.

FIG. 4c is a LED lamp of the present invention. Transparent cover 429 seals the LED lamp. The LED 427 is disposed on heat sink 420 which has a neck portion 422 for holding dome 428. Pole 424 is electrically connected with the one side of LED 427. Wire bonding 421 connects LED 427 to pole 425 which is passing through hole 423 and is electrically isolated from heat sink 420. Cover 429 sits on reflective cup 426 which directs emitted light to the desired direction. Note that, unlike the lamps of LEDs of prior art in which dome 400 is surrounding reflective cup 404, reflective cup 426 of the LED lamp of the present invention is surrounding dome 428, therefore the total internal reflection between dome and air is eliminated as long as the diameter of the hemisphere-shaped dome satisfies Equation (1).

Although the description above contains many specifications and embodiments, these should not be construed as limiting the scope of the present invention but as merely providing illustrations of some of the presently preferred embodiments of the present invention.

Therefore the scope of the present invention should be determined by the claims and their legal equivalents, rather than by the examples given.

What is claim is:

1. A high brightness light emitting diode (LED) emitting light of white or desire color, comprising:
   a substrate;
   an epitaxial layer comprising a first-type cladding layer disposed on said substrate, a first active layer emitting light of first wavelength and disposed on said first-type cladding layer, a second active layer emitting light of second wavelength and disposed on said first active layer, and a second-type cladding layer disposed on said second active layer; wherein a material system of said first active layer is selected from a group comprising $(Al_xGa_{1-x})_yIn_{1-y}P_zN_{1-z}$ ($0<x\leq1$, $0<y\leq1$, $0<z<1$); wherein a material system of said second active layer is selected from a group comprising $(Al_xGa_{1-x})_yIn_{1-y}P_zN_{1-z}$ ($0<x\leq1$, $0<y\leq1$, $0<z\leq1$);
   a first electrode disposed on an exposed portion of said first-type cladding layer;
   a second electrode disposed on said second-type cladding layer.

2. The high brightness light emitting diode (LED) of claim 1, further comprises a transition active layer sandwiched between said first and said second active layers.

3. The high brightness light emitting diode (LED) of claim 2, wherein a material system of said transition active layer is selected from a group comprising $(Al_xGa_{1-x})_yIn_{1-y}P_zN_{1-z}$ ($0<x\leq1$, $0<y\leq1$, $0<z\leq1$).

4. The high brightness light emitting diode (LED) of claim 1, wherein a material system of said first cladding layer is selected from a group comprising $B_xAl_yGa_zIn_{1-x-y-z}P_uN_{1-u}$ ($0<x\leq1$, $0\leq y<1$, $0\leq z<1$, $x+y+z\leq1$, $0\leq u\leq1$).

5. The high brightness light emitting diode (LED) of claim 1, wherein a material system of said second cladding layer is selected from a group comprising $B_xAl_yGa_zIn_{1-x-y-z}P_uN_{1-u}$ ($0<x<1$, $0\leq y<1$, $0\leq z<1$, $x+y+z\leq1$, $0\leq u\leq1$).

6. A high brightness emitting diode (LED) emitting light of white or desire color, comprising:
   an electrical conductive submount;
   an epitaxial layer comprising a first-type cladding layer, a first active layer disposed on said first-type cladding layer and emitting light of first wavelength, a second active layer disposed on said first active layer and emitting light of second wavelength, a second-type cladding layer disposed between said second active layer and one side of said submount;
   wherein a material system of said first active layer is selected from a group comprising $(Al_xGa_{1-x})_yIn_{1-y}P_zN_{1-z}$ ($0<x\leq1$, $0<y\leq1$, $0\leq z<1$); wherein a material system of said second active layer is selected from a group comprising $(Al_xGa_{1-x})_yIn_{1-y}P_zN_{1-z}$ ($0<x\leq1$, $0<y\leq1$, $0<z\leq1$); 'a first electrode disposed on said first-type cladding layer;
   a second electrode disposed on the other side of said submount.

7. The high brightness light emitting diode (LED) of claim 6, further comprises a transition active layer sandwiched between said first and said second active layers.

8. The high brightness light emitting diode (LED) of claim 7, wherein a material system of said transition active layer is selected from a group comprising $(Al_xGa_{1-x})_yIn_{1-y}P_zN_{1-z}$ ($0<x\leq1$, $0<y\leq1$, $0<z\leq1$).

9. The high brightness light emitting diode (LED) of claim 6, further comprising a reflector/Ohmic layer sandwiched between said submount and said second-type cladding layer.

10. The high brightness light emitting diode (LED) of claim 9, wherein said reflector/Ohmic layer comprises materials selected from a group comprising metals of Al, Au, Ag, In, Ni, ti, Pd, pt, alloys of said metals, and TiN or HfN.

11. The high brightness light emitting diode (LED) of claim 6, wherein a material system of said first cladding layer is selected from a group comprising $B_xAl_yGa_zIn_{1-x-y-z}P_uN_{1-u}$ ($0<x\leq1$, $0\leq y<1$, $0\leq z<1$, $x+y+z\leq1$, $0\leq u<1$).

12. The high brightness light emitting diode (LED) of claim 6, wherein a material system of said second cladding layer is selected from a group comprising $B_xAl_yGa_zIn_{1-x-y-z}P_uN_{1-u}$ ($0<x\leq1$, $0\leq y<1$, $0\leq z<1$, $x+y+z\leq1$, $0\leq u\leq1$).

13. The high brightness light emitting diode (LED) of claim 6, wherein said first electrode is patterned for improving current crowding, distributing current more uniformly, increasing current density, and fully utilizing the material of said active layers.

14. The high brightness light emitting diode (LED) of claim 13, wherein said patterned first electrode is a ring-grid-shape.

15. The high brightness light emitting diode (LED) of claim 13, wherein said patterned first electrode is a plus-multi-ring-shape.

* * * * *